US012713790B2

(12) United States Patent
Gu

(10) Patent No.: US 12,713,790 B2
(45) Date of Patent: Aug. 18, 2026

(54) DISPLAY PANEL AND DISPLAY DEVICE

(71) Applicant: WUHAN TIANMA MICROELECTRONICS CO., LTD., Wuhan (CN)

(72) Inventor: Jiachang Gu, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 534 days.

(21) Appl. No.: 18/338,360

(22) Filed: Jun. 21, 2023

(65) Prior Publication Data

US 2023/0337493 A1 Oct. 19, 2023

(30) Foreign Application Priority Data

Mar. 27, 2023 (CN) ......................... 202310328029.1

(51) Int. Cl.
*G09G 3/32* (2016.01)
*H10K 59/131* (2023.01)

(52) U.S. Cl.
CPC ................................. *H10K 59/131* (2023.02)

(58) Field of Classification Search
CPC ............... H10K 59/131; H10K 59/353; H10K 59/1315; G09G 3/3233; G09G 2300/0426; G09G 3/32; G09G 3/3208; G09G 2330/021
See application file for complete search history.

(56) References Cited

U.S. PATENT DOCUMENTS

2005/0029937 A1* 2/2005 Kim .................... H10K 59/131 313/506
2016/0190521 A1 6/2016 Lee et al.
2017/0294502 A1 10/2017 Ka et al.
2019/0146621 A1* 5/2019 Aoki .................... G06F 3/0443 345/174
2020/0394959 A1* 12/2020 Lou ..................... H10K 59/353
2021/0313415 A1 10/2021 Ma et al.
2021/0367025 A1 11/2021 Huang et al.
2022/0208124 A1 6/2022 Choi et al.

FOREIGN PATENT DOCUMENTS

CN 113161404 A 7/2021
CN 114677961 A 6/2022
CN 114708796 A 7/2022
CN 115768205 A 3/2023
CN 113316851 B 8/2024

OTHER PUBLICATIONS

Office Action of Corresponding CN Patent Application No. 202310328029.1 dated May 28, 2025.

* cited by examiner

*Primary Examiner* — Pegeman Karimi
(74) *Attorney, Agent, or Firm* — KILPATRICK TOWNSEND & STOCKTON LLP

(57) ABSTRACT

A display panel and a display device are provided. The display panel includes a display area and a non-display area at least partially surrounding the display area. The display panel further includes: a first power bus arranged in the display area; a second power bus arranged in the non-display area and electrically connected to the first power bus; and a third power bus arranged in the non-display area. The display area also includes: pixel circuits and light-emitting elements electrically connected to the pixel circuits. The first power bus is connected to the light-emitting elements. The third power bus is connected to the pixel circuits.

18 Claims, 13 Drawing Sheets

DISPLAY PANEL AND DISPLAY DEVICE

The present application claims priority to Chinese Patent Application No. 202310328029.1, titled "DISPLAY PANEL AND DISPLAY DEVICE", filed on Mar. 27, 2023 with the China National Intellectual Property Administration, which is incorporated herein by reference in its entirety.

FIELD

The present disclosure relates to the field of display technology, and in particular to a display panel and a display device.

BACKGROUND

Display panels are gradually developing towards thinner and lighter, high screen-to-body ratio and ultra-narrow bezel. The display panel usually includes a display area and a non-display area around the display area, the non-display area is configured to arrange signal lines. As the non-display area of the display panel becomes narrower, the width of the signal lines arranged in the non-display area also becomes smaller and smaller, resulting in an increase in the voltage drop of the signal lines.

Therefore, how to reduce the voltage drop of the signal lines becomes a challenge.

SUMMARY

A display panel and a display device are provided according to embodiments of the present disclosure, to reduce the voltage drop of signal lines.

In one embodiment, a display panel is provided according to the embodiments of the present disclosure. The display panel includes a display area and a non-display area at least partially surrounding the display area. The display panel further includes: a first power bus, arranged in the display area; a second power bus, arranged in the non-display area and electrically connected to the first power bus; a third power bus, arranged in the non-display area. The display area includes: pixel circuits and light-emitting elements electrically connected to the pixel circuits. The first power bus is connected to the light-emitting elements. The third power bus is connected to the pixel circuits.

In one embodiment, a display device is provided according to the embodiments of the present disclosure. The display device includes the display panel according to the embodiments.

According to the display panel and the display device provided in the embodiments of the present disclosure, instead of arranging power buses electrically connected to the light-emitting elements in the non-display area, the power buses electrically connected to the light-emitting elements are divided into the first power bus and the second power bus connected in parallel. The first power bus is arranged in the display area and the second power bus is arranged in the non-display area. In this way, it is not only beneficial to achieve narrow bezel, but also beneficial to reduce the overall impedance of the power buses connected to the light-emitting elements, to reduce the voltage drop (IR Drop) of the power buses connected to the light-emitting elements, which improves the display effect and reduce power consumption.

BRIEF DESCRIPTION OF THE DRAWINGS

By reading the detailed description of non-limiting embodiments with reference to the accompanying drawings, embodiments of the present disclosure become more apparent. The same or similar reference signs represent the same or similar features, and the drawings are not drawn to the actual scale.

DETAILED DESCRIPTION OF EMBODIMENTS

Figure 1:
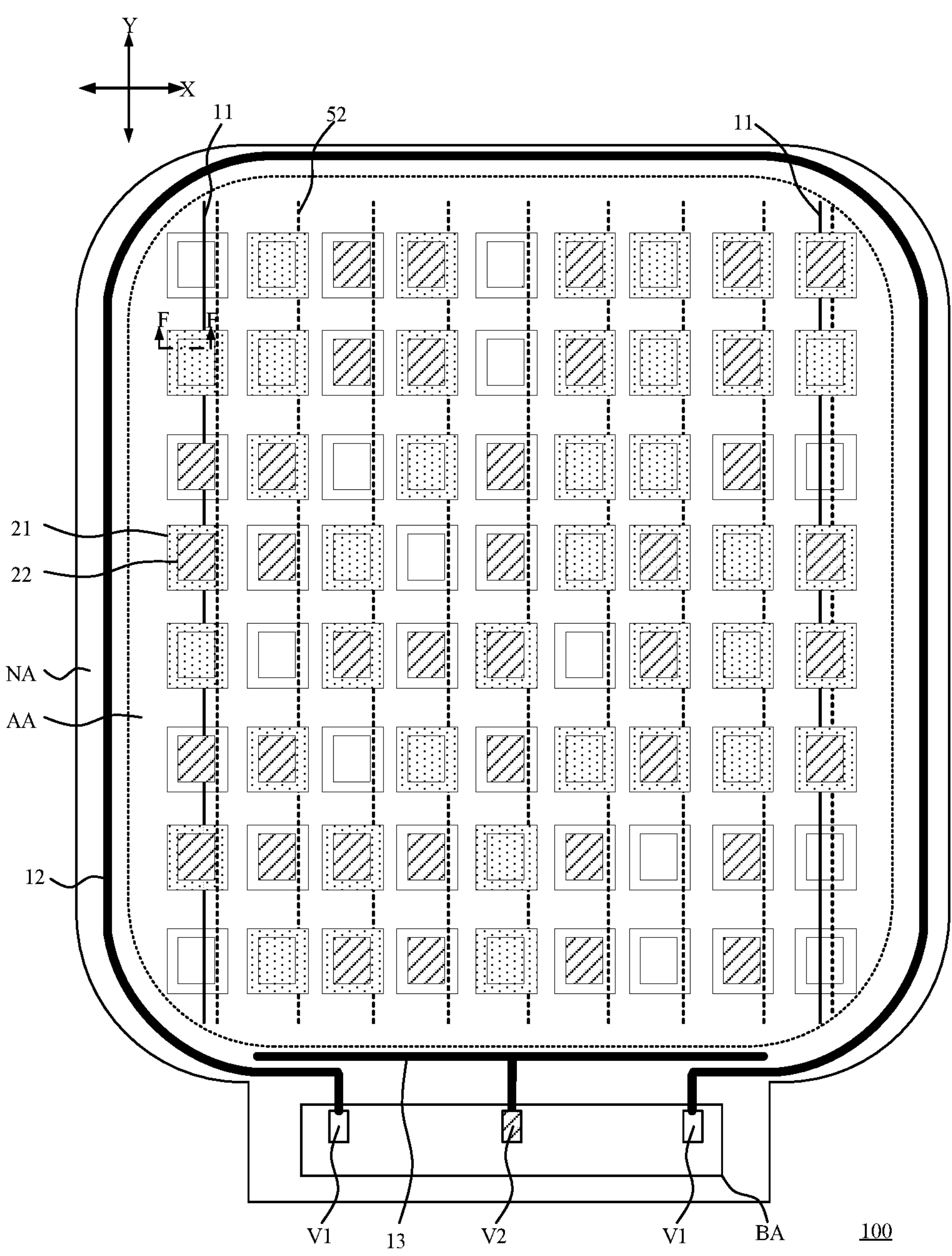
FIG. 1 shows a top view of a display panel according to an embodiment of the present disclosure.

Features and exemplary embodiments of the present disclosure are described in detail below. In order to make the embodiments of the present disclosure clearer, the present disclosure is further described in detail below in conjunction with the accompanying drawings and embodiments. It should be understood that the embodiments described herein are only configured to explain the present disclosure and are not configured to limit the present disclosure. Embodiments of the present disclosure can be implemented without some of these specific details. The following description of the embodiments is only to provide a better understanding of the present disclosure by showing examples of the present disclosure.

It should be noted that in this description, relational terms such as "first" and "second" are only used to distinguish one entity or operation from another entity or operation, and do not necessarily require or imply any actual relationship or order between the entities or operations. Moreover, terms such as "comprise", "include", or any other variation thereof are intended to cover non-exclusive inclusion, and a process, method, article, or device that includes a series of elements not only includes the series of elements, but also other elements not explicitly listed, or also includes elements inherent in such a process, method, article, or device. Without further limitations, an element limited by the statement "comprise . . . " does not exclude the existence of other identical element in the process, method, article, or device that includes the element.

It should be understood that when describing the structure of a component, in the case of a layer or region is described as being "on" or "over" another layer or region, it may indicate that the layer or region is directly on another layer or area, or other layers or regions are further included between the layer or region and another the layer or region. In addition, if the component is flipped, the layer or region will be "below" or "beneath" another layer or region.

It should be understood that the term "and/or" herein is only a description of the association relationships of the associated objects, indicating that there may be three relationships, for example, A and/or B may represent three situations: A exists alone, A and B exist simultaneously, and B exists alone. In addition, the character "/" in this description generally indicates that a relationship of the pre and the post associated objects is an "or" relationship.

The term "connected" may refer to "electrically connect" or "electrically connect without intermediate transistors". The term "insulate" may refer to "electrically insulate" or "electrically isolate". The term "drive" may refer to "control" or "operate". The term "part" may refer to "local". The term "end" may refer to "end segment" or "edge of an end". The display panel may be a display device or a module/part of a display device.

Various modifications and changes can be made in the present disclosure without departing from spirits or scopes of the present disclosure. The present disclosure intends to cover the modifications and changes of the present disclosure that fall within the scopes of the corresponding claims (claimed embodiments) and their equivalents. It should be noted that Implementations according to the embodiments of the present disclosure may be combined with each other without contradiction.

A display panel and a display device are provided according to embodiments of the present disclosure. Various embodiments of the display panel and the display device are described below with reference to the accompanying drawings As shown in FIG. 1, a display panel 100 may include a display area AA and a non-display area NA at least partially surrounding the display area AA.

The display panel 100 may include a first power bus 11, a second power bus 12, and a third power bus 13. The first power bus 11 is arranged in the display area AA, and the second power bus 12 and the third power bus 13 are arranged in the non-display area NA.

The display area AA of the display panel 100 may also include pixel circuits 21 and light-emitting elements 22 electrically connected to the pixel circuits 21. The pixel circuits 21 may be configured to generate driving currents to drive the light-emitting elements 22 to emit light. The light-emitting elements may include at least one of organic light-emitting diodes (OLEDs) and micro light-emitting diodes (Micro LEDs).

The first power bus 11 and the second power bus 12 are electrically connected, and the first power bus 11 is connected to the light-emitting elements 22. Understandably, the first power bus 11 and the second power bus 12 may be connected in parallel.

The third power bus 13 is connected to the pixel circuits 21.

In an embodiment, the light-emitting element 22 may include a first electrode, a light-emitting layer, and a second electrode. The pixel circuit 21 may be electrically connected to the first electrode, and the first power bus 11 and second power bus 12 may be electrically connected to the second electrode. The first electrode may be an anode, the second electrode may be a cathode, or the first electrode may be a cathode, and the second electrode may be an anode.

Understandably, the first power bus 11 and the light-emitting elements 22 may be directly contacted, or the first power bus 11 and the light-emitting elements 22 may be connected through connection structures, or the first power bus 11 and the light-emitting elements 22 may be connected through contact holes.

The first power bus 11 and the second power bus 12 may be electrically connected to a first power supply end V1, and the first power supply end V1 may be configured to provide a negative voltage signal. The third power bus 13 may be electrically connected to a second power supply end V2, and the second power supply end V2 may be configured to provide a positive voltage signal. The non-display area NA may include a binding area BA, and the first power supply end V1 and the second power supply end V2 may be arranged in the binding area BA. In one embodiment, the binding area BA may also include pads (not shown).

According to the display panel provided by the embodiment of the present disclosure, instead of arranging the power buses connected to the light-emitting elements 22 in the non-display area, the power buses connected to the light-emitting elements 22 are divided into the first power bus 11 and the second power bus 12 connected in parallel. The first power bus 11 is arranged in the display area AA, and the second power bus 12 is arranged in the non-display area NA. In this way, it is not only beneficial to achieve narrow bezel, but also beneficial to reduce the overall impedance of the power buses connected to the light-emitting elements 22, to reduce the voltage drop of the power buses connected to the light-emitting elements 22, which improves the display effect and reduce power consumption.

Figure 2:
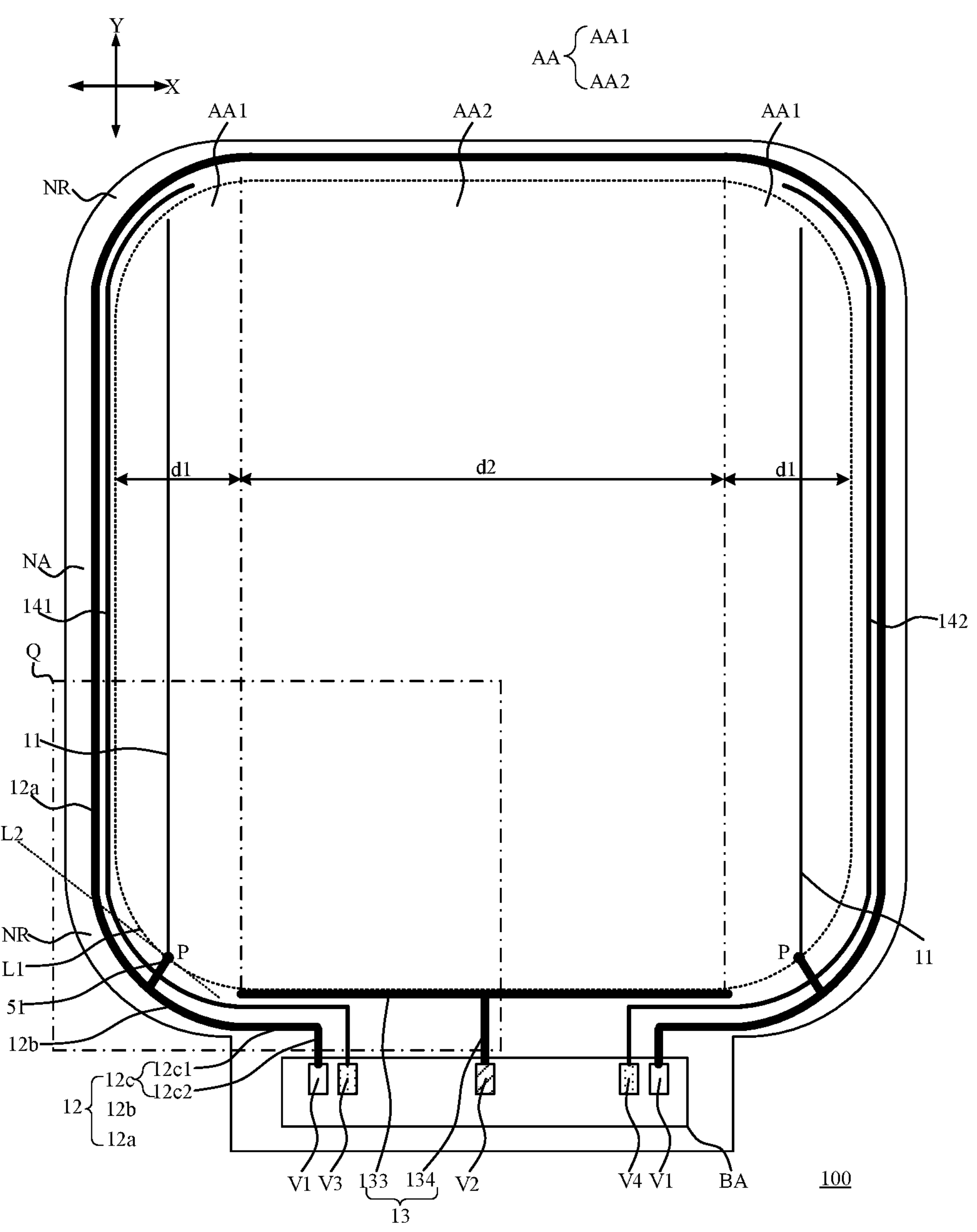
FIG. 2 shows another top view of a display panel according to an embodiment of the present disclosure.

In some embodiments, as shown in FIG. 2, the display area AA may include a first display area AA1 and a second display area AA2 which are adjacent. In a first direction X, the first display areas AA1 are arranged between the non-display area NA and the second display area AA2. The first power bus 11 may be arranged in the first display area AA1. The first power bus 11 may not be arranged in the second display area AA2.

In the embodiment of the present disclosure, the first power bus 11 is arranged in the first display area AA1 close the non-display area NA and near the second power bus 12, and it is more convenient to realize the electrical connection between the first power bus 11 and the second power bus 12.

In an embodiment, in the first direction X, two first display areas AA1 are arranged on both side of the second display area AA2.

Figure 3:
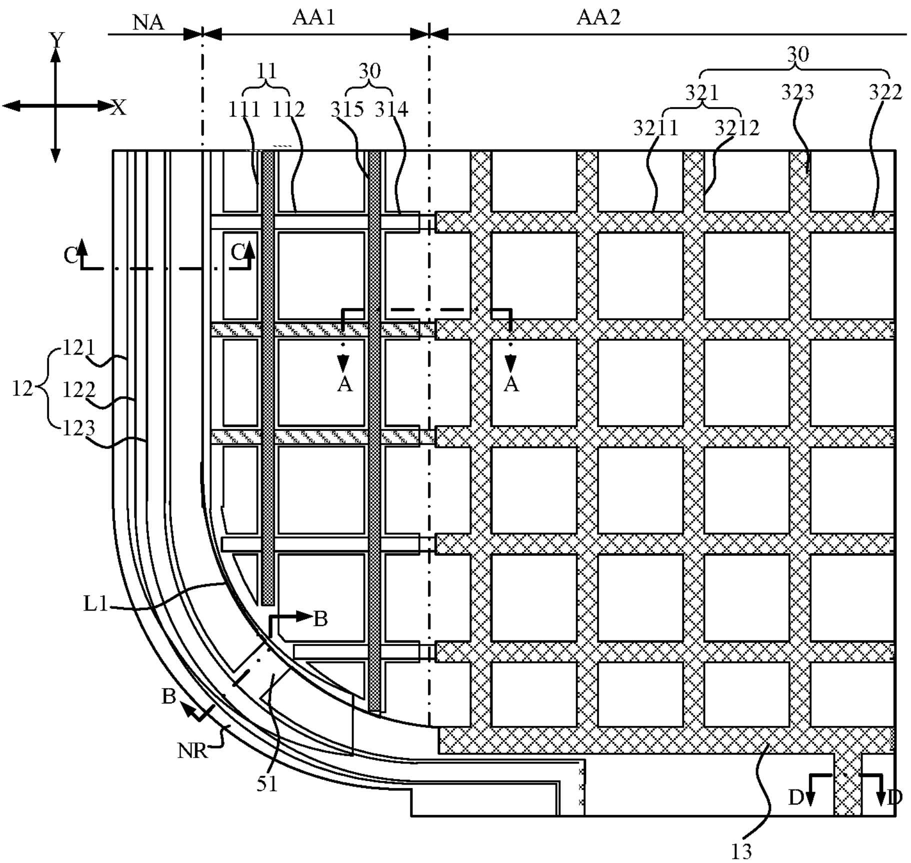
FIG. 3 shows a schematic diagram of a distribution of signal lines in a Q region of FIG. 2.

In some embodiments, as shown in FIG. 3, the display panel may further include a first power supply signal line 30, and the first power supply signal line 30 is electrically connected to the third power bus 13. The third power bus 13 is electrically connected to the pixel circuit 21 in the display area AA through the first power supply signal line 30. pixel circuits 21 may be distributed in an array in the display area AA. Both the first display area AA1 and the second display area AA2 are provided with the first power supply signal lines 30, to facilitate the first power supply signal lines 30 to provide power supply signals to the pixel circuits 21 distributed in the array.

The first power supply signal line 30 in the second display area AA2 may include sub signal lines which are arranged in different film layers and electrically interconnected. For example, the first power supply signal line 30 in the second display area AA2 may include first sub signal lines and second sub signal lines which are arranged in different film layers and electrically interconnected. The first power bus 11 and at least one of the first sub signal lines in the second display area AA2 may be arranged in a same film layer, and at least one of the second sub signal lines in the second display area AA2 and the first power bus 11 may be arranged in different film layers.

It should be noted that in the case that the first power bus 11 and the first sub signal line are arranged in the same film layer, they are made of a same material and prepared by a same process and same steps. In the embodiment of the present disclosure, when two or more structures are arranged in a same film layer, the structures may be made of a same material and may be prepared by a same process and same steps.

FIG. 3 exemplarily shows that the first power supply signal line 30 in the second display area AA2 includes first sub signal lines 321, second sub signal lines 322 and third sub signal lines 323 which are arranged in different film layers and are electrically connected. The first power bus 11 and the first sub signal lines 321 may be arranged in a same film layer. The second sub signal lines 322 and the third sub signal lines 323 may be arranged in different film layers from the first power bus 11.

Understandably, in the case that the first power bus 11 is not arranged in the first display area AA1, sub signal lines of the first power supply signal line 30 may be arranged at the position of the first power bus 11 in FIG. 3. In the embodiment of the present disclosure, the position of the first power bus 11 in the first display area AA1 is no longer provided with the sub signal lines of the first power supply signal line 30, but with the first power bus 11, in this way the first power bus 11 occupies the position of at least one sub signal line of the first power supply signal line 30. Therefore, it is not required to add an additional film layer to arrange the first power bus 11, which is beneficial to the thinning and lightening of the display panel.

It should be noted that signal lines with a same filling pattern in FIG. 3 are arranged in a same film layer. As shown in FIG. 2, a width of the first display area AA1 in the first direction X is d1, and a width of the second display area AA2 in the first direction X is d2, and d1<d2. Since the width of the first display area AA1 is smaller, an area of the first power supply signal line 30 occupied by the first power bus 11 is small, and the impact on the overall voltage drop of the first power supply signal line 30 is small. Therefore no additional film layer is required to be added to arrange the first power bus 11, while the impact on display quality can be reduced.

In an embodiment, 2d1<d2. In the case that two first display areas AA1 are arranged on the display panel and the two first display areas AA1 are arranged between the non-display area NA and the second display area AA2, the second display area AA2 is provided with substantially the same first power bus 11 on the left and right sides, and the signal environments on both sides of the second display area AA2 are generally consistent, improving the display effect of the display panel.

In an embodiment, as shown in FIG. 2, the first display area AA1 may include an arc edge, and the second display area AA2 may include a straight edge. The arc edge of the first display area AA1 may be R rounded edge, and the first power bus 11 only occupies the local display area corresponding to the R rounded corner, and the impact on the overall voltage drop of the first power supply signal line 30 is small.

Figure 4:
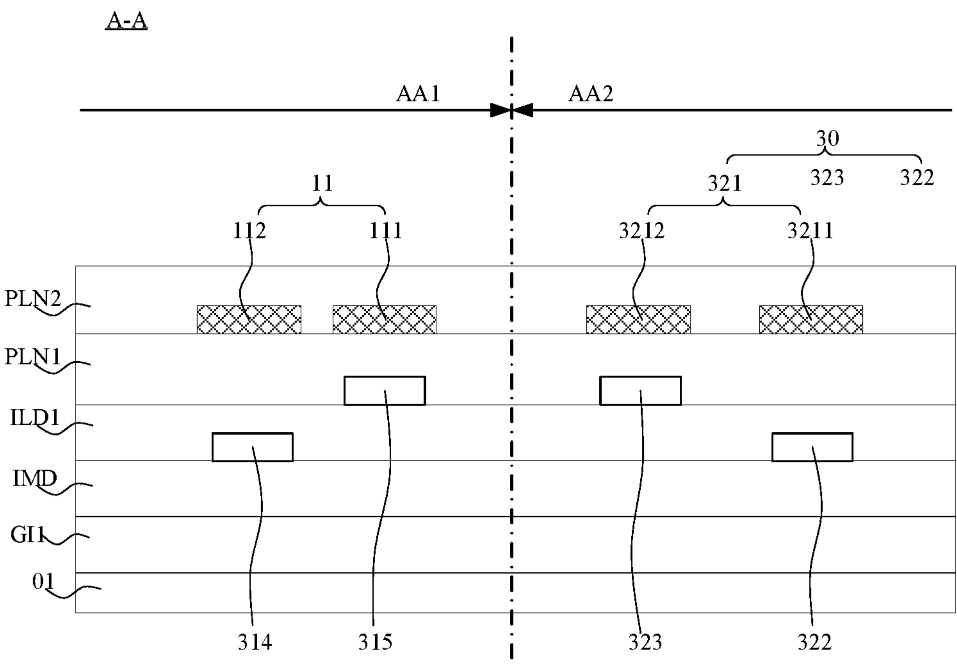
FIG. 4 shows a schematic diagram of a cross-section structure along A-A direction in FIG. 3.

As shown in FIG. 4, the display panel may include a substrate 01. sub signal lines of the first power supply signal line 30 may be arranged on one side of substrate 01. In the second display area AA2, sub signal lines of the first power supply signal line 30 may be distributed in at least two film layers. For example, in the second display area AA2, the first power supply signal line 30 may include first sub signal lines 321 and second sub signal lines 322. The first sub signal lines 321 and the second sub signal lines 322 are arranged in different film layers. In a thickness direction of the display panel, the first sub signal lines 321 are arranged on the side of the second sub signal lines 322 away from the substrate 01. The first power bus 11 and the first sub signal lines 321 may be arranged in a same film layer.

The thickness direction of the display panel is the stacking direction of the film layers of the display panel. Insulation layers are arranged between the sub signal lines of different film layers. In FIG. 4, a metal layer or a semiconductor layer may be arranged between the second sub signal lines 322 and the substrate 01, and insulation layers may be arranged between the second sub signal lines 322 and the substrate 01.

The first power bus 11 is required to be connected to the light-emitting elements, and the light-emitting elements may be arranged on the side of the first power supply signal line 30 away from the substrate (not shown in the figure). For example, the first power bus 11 may be electrically connected to the light-emitting elements through contact holes, and the first power bus 11 and the first sub signal lines 321 away from the substrate are arranged in a same layer, which facilitates the electrical connection between the first power bus 11 and the light-emitting elements. For example, the contact holes between the first power bus 11 and the light-emitting elements can be avoided from being too deep.

The contact holes between the first power bus 11 and the light-emitting elements may be directly lapped to the first power bus 11 and the light-emitting elements. The first power bus 11 may be directly lapped to the contact holes, and the contact holes may be connected to the light-emitting elements through other connection structures.

In some embodiments, in order to further reduce the voltage drop of the first power supply signal line 30, as shown in FIGS. 3 and 4, in the second display area AA2, the first power supply signal line 30 may include third sub signal lines 323. In the thickness direction of the display panel, the third sub signal lines 323 may be arranged between the first sub signal lines 321 and the second sub signal lines 322.

The first sub signal lines 321, the second sub signal lines 322 and the third sub signal lines 323 are electrically interconnected. For example, the first sub signal lines 321 may be connected to the third sub signal lines 323 through contact holes, and the third sub signal lines 323 may be connected to the second sub signal lines 322 through contact holes, to realize the electrical connection between the three sub signal lines.

In some embodiments, the sub signal lines arranged in the same film layer as the first power bus 11 may be arranged in a grid structure. As an example, the first sub signal line 321 and the first power bus 11 are arranged in the same film layer, as shown in FIG. 3, the first sub signal line 321 may include first sub wires 3211 extending in a first direction X and second sub wires 3212 extending in a second direction Y. The first direction X intersects with the second direction Y. For example, the first direction X may be a row direction, and the second direction Y may be a column direction. In this way, first sub wires 3211 and second sub wires 3212 may form grid-shaped first sub signal line 321, which is more conducive to reducing the voltage drop of the first power supply signal line 30.

In an embodiment, the first sub wires 3211 and the second sub wires 3212 may be arranged in a same film layer.

The first power bus 11 may have a grid structure to reduce the voltage drop of the first power bus 11.

In an embodiment, as shown in FIG. 3, the first power bus 11 may include first branch lines 111 extending in a second direction Y and second branch lines 112 extending in a first direction X, the first direction X intersects with the second direction Y, and first branch lines 111 and second branch lines 112 may form a grid-shaped first power bus 11.

The first branch lines 111 and the second branch lines 112 may be arranged in the same film layer.

In an embodiment, as shown in FIG. 3, the first power supply signal line 30 in the first display areas AA1 may have a grid structure to reduce the voltage drop of the first power supply signal line 30.

For example, in the first display area AA1, the first power supply signal line 30 may include fourth sub signal lines 314 extending in a first direction X and fifth sub signal lines 315 extending in a second direction Y. fourth sub signal lines 314 and fifth sub signal lines 315 intersect each other to form grid-shaped first power supply signal line 30.

The fourth sub signal lines 314 and the fifth sub signal lines 315 may be arranged in different film layers.

In some embodiments, the second sub signal line arranged in the second display area AA2 and arranged in a different film layer from the first power bus 11, and the first power supply signal line 30 in the first display areas AA1 may be arranged in a same film layer. In this way, without increasing the number of film layers, the first power supply signal line 30 may be arranged in both the first display area AA1 and the second display area AA2, which is conducive to the thinning and lightening of the display panel.

For example, the second sub signal line 322 and the fourth sub signal line 314 may be arranged in a same film layer, while the third sub signal line 323 and the fifth sub signal line 315 may be arranged in a same film layer. The second sub signal line 322 and the fourth sub signal line 314 may both extend in the first direction X, and the second sub signal line 322 and the fourth sub signal line 314 may be directly lapped.

Figure 5:
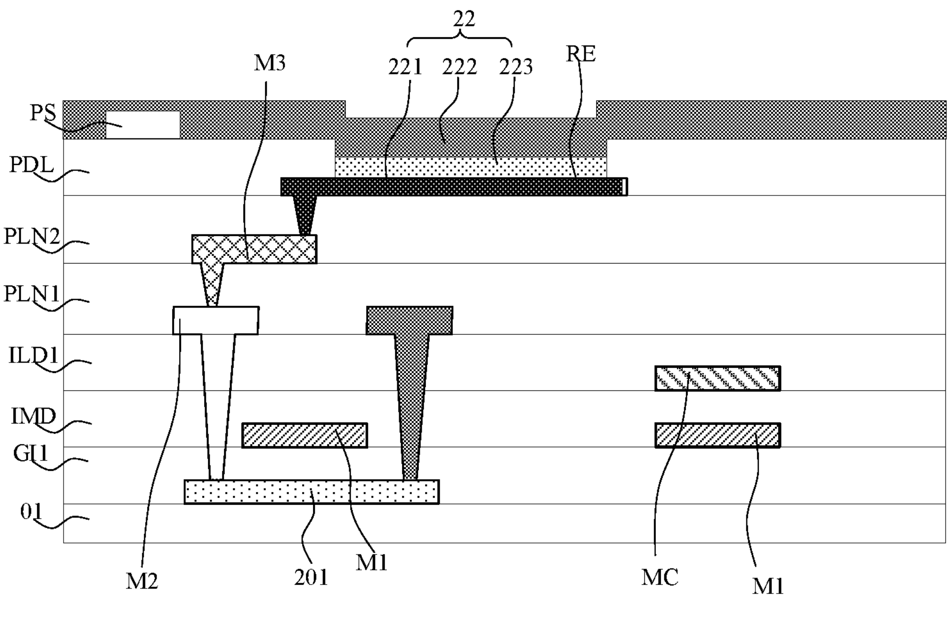
FIG. 5 shows a schematic diagram of a film layer structure of a display panel according to an embodiment of the present disclosure.
Figure 6:
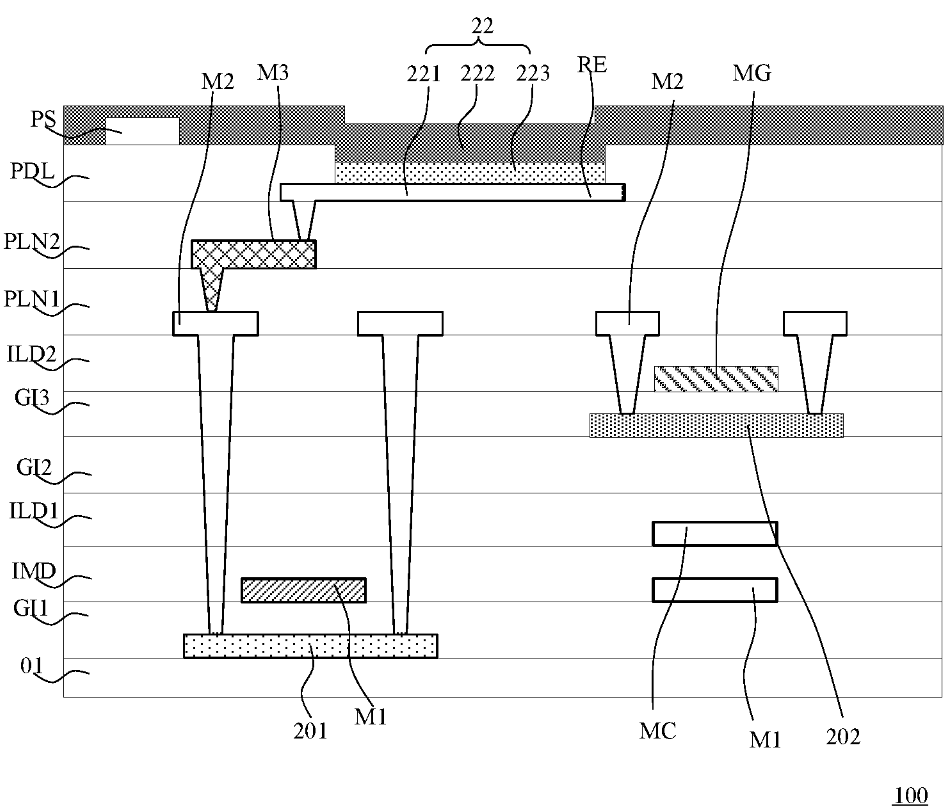
FIG. 6 shows a schematic diagram of another film layer structure of a display panel according to an embodiment of the present disclosure.

As shown in FIG. 5 or FIG. 6, the display panel may include a first metal layer M1, a capacitor metal layer MC, a second metal layer M2 and a third metal layer M3. The first metal layer M1, the capacitor metal layer MC, the second metal layer M2, and the third metal layer M3 are successively stacked away from the substrate 01. The first sub signal line 321 may be arranged in the third metal layer M3, the second sub signal line 322 may be arranged in the capacitor metal layer MC, and the third sub signal line 323 may be arranged in the second metal layer M2. The first branch line 111 and the second branch line 112 may be arranged in the third metal layer M3. The fourth sub signal line 314 may be arranged in the capacitor metal layer MC, and the fifth sub signal line 315 may be arranged in the second metal layer M2. Data lines 52 of the display panel may be arranged in the second metal layer M2.

As an example, the display panel may be a low temperature polysilicon (LTPS) display panel. As shown in FIG. 5, the display panel may include a first semiconductor layer 201, and the first semiconductor layer 201 may include an active layer of a transistor. The materials of the active layer may include low-temperature polycrystalline silicon, such as P—Si. The insulation layers of the display panel may include a first gate insulation layer GI1, a capacitor insulation layer IMD, a first interlayer dielectric layer ILD1, a first planarization layer PLN1 and a second planarization layer PLN2. The display panel may further include a pixel definition layer PDL and a support pillar PS.

As another example, the display panel may be a low temperature polycrystalline oxide (LTPO) display panel. As shown in FIG. 6, the display panel may further include a second semiconductor layer 202, and the second semiconductor layer 202 may include an active layer of a transistor. The materials of the active layer may include metal oxides, such as indium gallium zinc oxide (IGZO). The similarities between FIG. 6 and FIG. 5 are not described anymore. As shown in FIG. 6, the display panel may further include a gate metal layer MG, and the insulation layers may further include a second gate insulation layer GI2, a third gate insulation layer GI3, and a second interlayer dielectric layer ILD2.

The specific position relationships of each film layer can be referred to FIGS. 5 and 6, and are not repeated here.

It should be noted that the grid wirings may not be regular horizontal and vertical alternations as shown in FIG. 3 sometimes due to existence of other structures in the display panel. The inventor found that if the first electrodes of the light-emitting elements are not smooth, the display panel may be caused problems such as chromaticity shift. In the thickness direction of the display panel, the structures inside the metal layer near the first electrodes may include block structures to improve the flatness of the first electrodes and prevent the chromaticity shift of the display panel under different viewing angles due to the first electrodes are not smooth.

Figure 7:
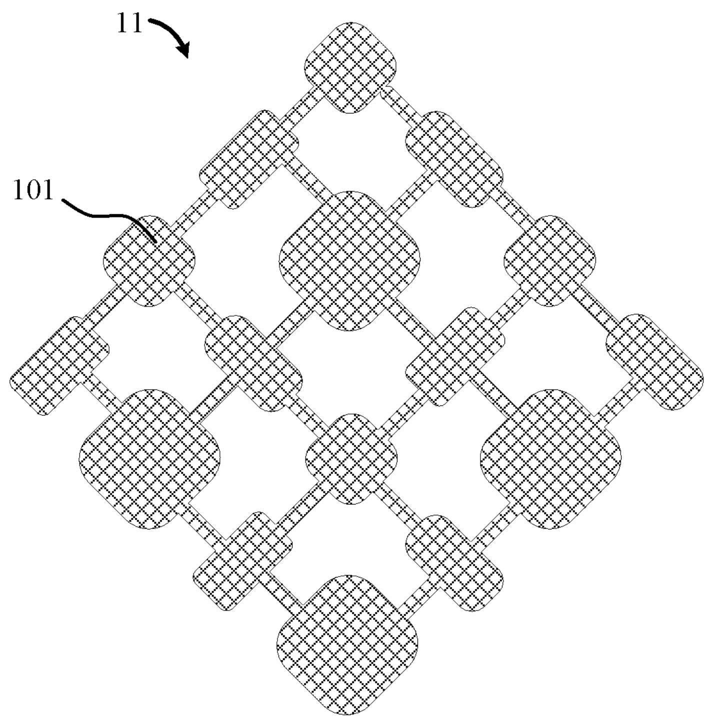
FIG. 7 shows a schematic diagram of a wiring structure in a display panel according to an embodiment of the present disclosure.

For example, the grid structure of the first power bus 11 and/or the first sub signal line 321 may be shown in FIG. 7. As shown in FIG. 7, the grid-shaped wirings may include a block structure 101. The block structure 101 may at least partially overlap with the first electrode of the light-emitting element in the thickness direction of the display panel.

In some embodiments, in the thickness direction of the display panel, the first power bus 11 and the first power supply signal line 30 in the first display area AA1 may at least partially overlap. In this way, even if the first power bus 11 and the first power supply signal line 30 are simultaneously arranged in the first display area AA1, pixel aperture ratio of the first display area AA1 may be guaranteed because the two are at least partially overlapped.

For example, as shown in FIG. 3, the first power bus 11 includes first branch lines 111 and second branch lines 112, and the first power supply signal line 30 in the first display area AA1 includes fourth sub signal lines 314 and fifth sub signal lines 315. As shown in FIG. 4, the first branch lines 111 and the fifth sub signal lines 315 may at least partially overlap, while the second branch lines 112 and the fourth sub signal lines 314 may at least partially overlap.

In the thickness direction of the display panel, in the second display area AA2, the sub signal lines of the first power supply signal line 30 in different film layers may at least partially overlap, ensuring a pixel aperture ratio of the second display area AA2. In one embodiment, the sub signal lines of the first power supply signal line 30 in different film layers may overlap.

For example, as shown in FIG. 3, the first power supply signal line 30 of the second display area AA2 may include first sub signal lines 321, second sub signal lines 322, and third sub signal lines 323. The first sub signal line 321 includes first sub wires 3211 and second sub wires 3212. As shown in FIG. 4, the first sub wires 3211 and the second sub signal lines 322 may at least partially overlap, while the second sub wires 3212 and the third sub signal lines 323 may at least partially overlap.

It should be noted that in FIG. 3, in order to illustrate different signal lines which extend in a same direction and overlap, different line widths are used to illustrate the different signal lines extending in the same direction. This does not indicate that the widths of the different signal lines which extend in the same direction and overlap must be different. In an embodiment, the widths of the different signal lines which extend in the same direction and overlap may be same, and in the thickness direction of the display panel, the signal lines that extend in the same direction and overlap described in the above embodiments may even completely overlap if process errors are allowed.

In some embodiments, as shown in FIG. 2, the first display area AA1 includes and arc edge L1, and the non-display area NA includes a corner area NR adjacent to the arc edge L1. The corner area NR may include a connection line 51, and the connection line 51 may be connected between the first power bus 11 and the second power bus 12. The second power bus 12 is connected to the first power supply end V1. The power supply signal provided by the first power supply end V1 may be sent to the first power bus 11 through the second power bus 12.

In an embodiment, as shown in FIG. 2, in the second direction Y, the non-display area NA may include two opposite corner areas NR, and the connection line 51 may only be arranged in the corner area NR close to the binding area BA. In one embodiment, the connection line 51 may be arranged in the corner area NR away from the binding area BA.

In some embodiments, as shown in FIG. 2, an intersection of the connection line 51 and the arc edge L1 is a tangent point P, and the tangent line passing through the tangent point P is L2. The connection line 51 may be perpendicular to the tangent line L2, and length of the connection line 51 can be minimize, which is beneficial to reduce the voltage drop of the connection line 51, and beneficial to narrow the bezel of the display panel.

In some embodiments, as shown in FIG. 2, the second power bus 12 may include a first segment **12*a*, an arc segment 12*b*, and a second segment 12*c*, the arc segment 12*b* is connected between the first segment 12*a* and the second segment 12*c*, and the second segment 12*c* is connected to the first power supply end V1. Within the allowable range of process errors, the arc segment 12*b* may tend to be parallel to the arc edge L1**. In this way, the space utilization rate of the corner area NR can be optimized, which is beneficial to reduce the bezel of the display panel.

In some embodiments, as shown in FIG. 2, the second segment **12*c* may include a first sub segment 12*c*1 and a second sub segment 12*c*2, the first sub segment 12*c*1 is connected between the arc segment 12*b* and the second sub segment 12*c*1**.

The third power bus 13 may include a third segment 133 and a fourth segment 134, the third segment 133 is connected between the fourth segment 134 and the first power supply signal line 30 of the display area, and the fourth segment 134 is connected to a second power supply end V2 of the display panel.

The first sub segment **12*c*1 and the third segment 133 may extend in the first direction X, the second sub segment 12*c*2 and the fourth segment 134** may extend in the second direction Y, and the first direction X intersects with the second direction Y.

In some embodiments, as shown in FIG. 3, the second power bus 12 includes sub buses arranged in different film layers and connected to each other. For example, the second power bus 12 may include a first sub bus 121, a second sub bus 122 and a third sub bus 123 arranged in different film layers and connected to each other. The connection line 51, the first power bus 11 and at least one sub bus may be arranged in a same film layer. In this way, the connection line 51 may be connected to the first power bus 11 and the second power bus 12 without punching holes. In addition, if the resistances changes suddenly, it is easy to generate static electricity weak points, and the connection of the metal in the same film layer can avoid sudden changes in resistance at the connection.

Figure 8:
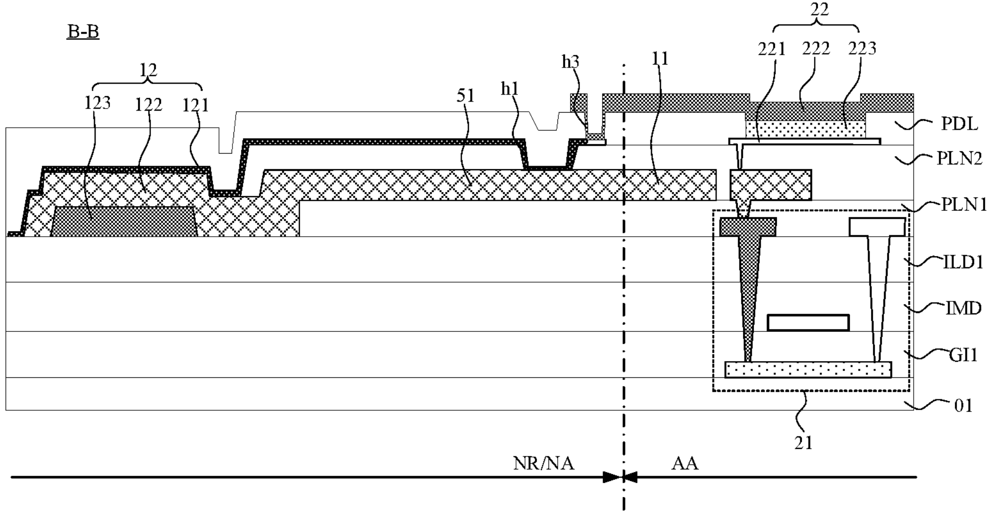
FIG. 8 shows a schematic diagram of a cross-section structure along B-B direction in FIG. 3.

In an embodiment, as shown in FIG. 8, the second sub bus 122 may be arranged between the third sub bus 123 and the first sub bus 121, and the third sub bus 123 may be arranged between the second sub bus 122 and the substrate 01.

In some embodiments, as shown in FIG. 8, the first power bus 11 may be connected to the sub bus farthest from the substrate 01 through a first contact hole h1. For example, in the thickness direction of the display panel, the first sub bus 121 is farthest from the substrate 01, and the first power bus 11 may be connected to the first sub bus 121 through the first contact hole h1. The first contact hole h1 may be arranged in the non-display area NA.

As shown in FIG. 5 or 6, the light-emitting element 22 includes a first electrode 221, a second electrode 222 and a light-emitting layer 223, and the second electrode 222 is arranged on the side of the light-emitting layer 223 away from the first electrode 221.

The first sub bus 121 and the first electrode 221 are arranged in a same film layer. For example, the first sub bus 121 and the first electrode 221 are arranged in an anode layer RE.

The second power bus 12 and the first power bus 11 are required to be connected to the second electrode of the light-emitting element in the display area. In the thickness direction of the display panel, compared to other sub buses, the first sub bus 121 is closer to the second electrode 222 of the light-emitting element 22, and the first sub bus 121 may be connected to the second electrode 222. In this way, a depth of the contact hole between the second power bus 12 and the second electrode 222 of the light-emitting element 22 can be avoided from being too deep. Understandably, in this case, the first power bus 11 is connected to the second electrode 222 of the light-emitting element 22 through the first sub bus 121.

In an embodiment, as shown in FIG. 8, the first sub bus 121 and the second electrode 222 of the light-emitting element 22 may be connected through a third contact hole h3. Understandably, since the first power bus 11 is connected to the first sub bus 121 through the first contact hole h1, and the first sub bus 121 is connected to the second electrode 222 of the light-emitting element 22 through the third contact hole h3, the first power bus 11 is electrically connected to the second electrode 222 of the light-emitting element 22.

In an embodiment, the third contact hole h3 between the first sub bus 121 and the second electrode 222 of the light-emitting element 22 may be arranged in the non-display area NA.

In an embodiment, the third sub bus 123 may be arranged in the second metal layer M2, the second sub bus 122 may be arranged in the third metal layer M3, and the connection line 51 and the first power bus 11 may be arranged in the third metal layer M3.

Figure 9:
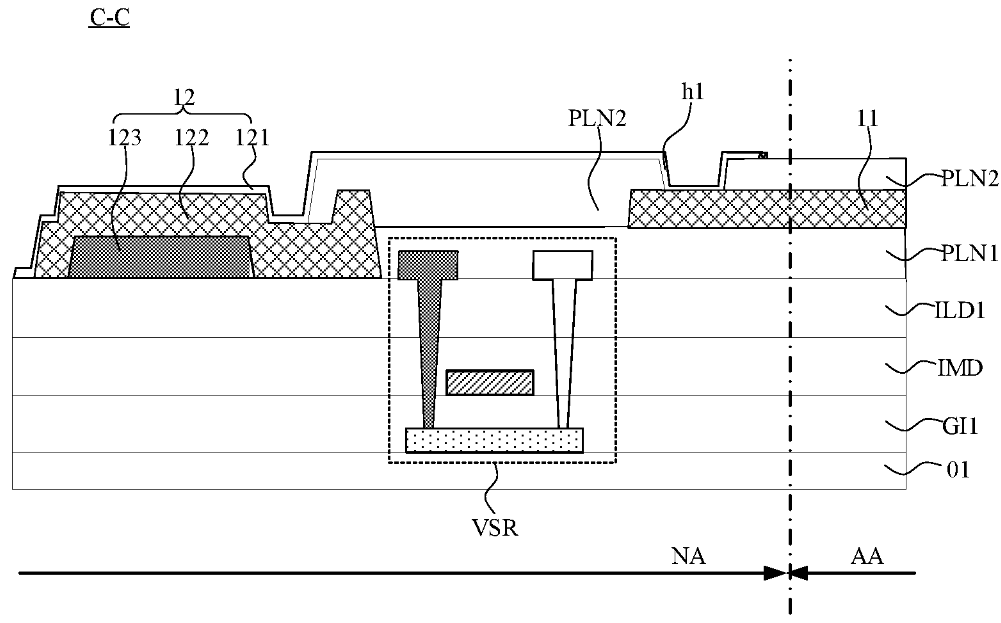
FIG. 9 shows a schematic diagram of a cross-section structure along C-C direction in FIG. 3.

In some embodiments, as shown in FIG. 9, the non-display area NA may include a shift register VSR, the shift register VSR may be configured to output a gate control signal, and the gate control signal may be configured to control on or off of the transistor in the pixel circuit 21.

Orthographic projections of other sub buses other than the first sub bus 121 on the substrate 01 may be arranged on the side of the orthographic projection of the shift register VSR on substrate 01 away from the display area AA. For example, the orthographic projections of the second sub bus 122 and the third sub bus 123 on the substrate 01 may be arranged on the side of the orthographic projection of the shift register VSR on the substrate 01 away from the display area AA. Understandably, the orthographic projections of the second sub bus 122 and the third sub bus 123 on the substrate 01 may not overlap with the orthographic projection of the shift register VSR on the substrate 01, to reduce signal interferences between the second power bus 12 and the shift register VSR.

Figure 10:
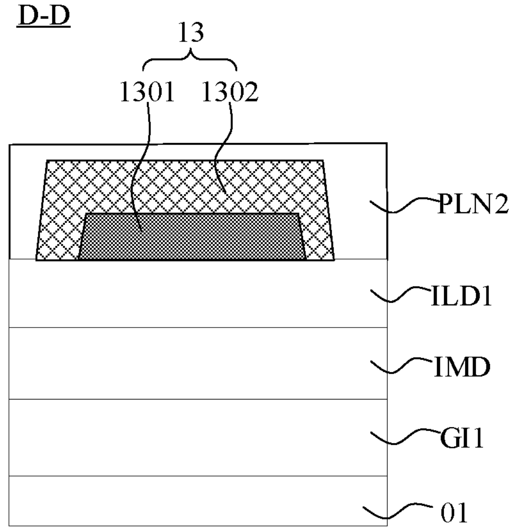
FIG. 10 shows a schematic diagram of a cross-section structure along D-D direction in FIG. 3.

In some embodiments, in order to reduce the voltage drop of the third power bus 13, as shown in FIG. 10, the third power bus 13 may be stacked and interconnected multi-layer wires. For example, the third power bus 13 may include a first wire 1301 and a second wire 1302, and the first wire 1301 is arranged between the second wire 1302 and the substrate 01.

In an embodiment, as shown in FIG. 5 or 6, the first wire 1301 may be arranged in the second metal layer M2, and the second wire 1302 may be arranged in the third metal layer M3.

Figure 11:
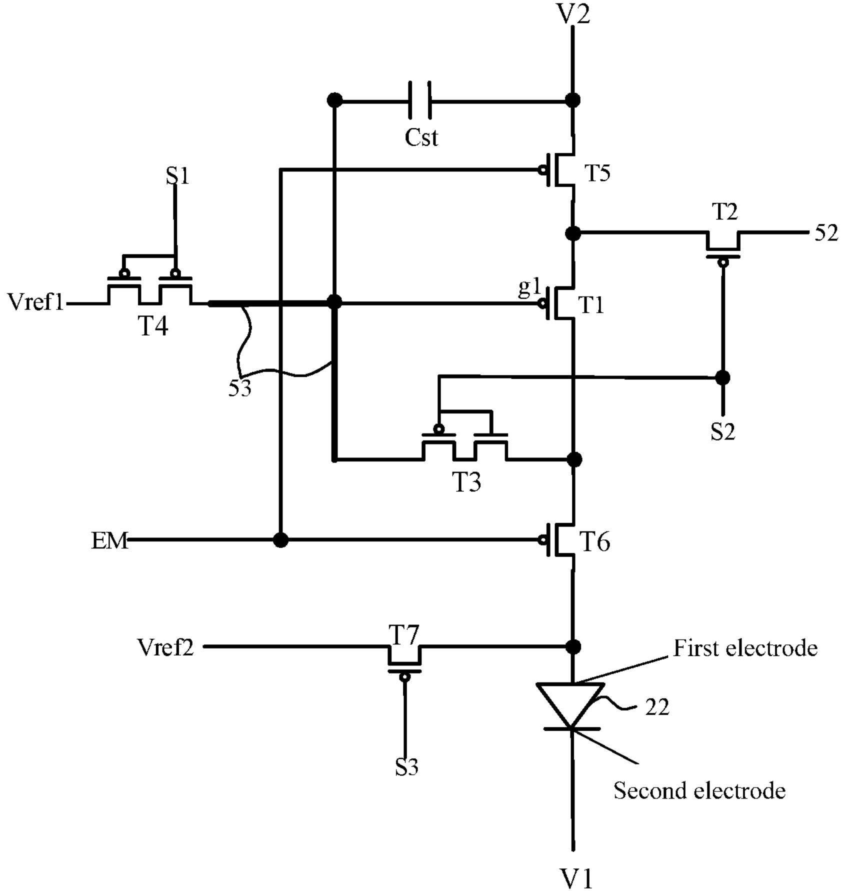
FIG. 11 shows a schematic diagram of a circuit structure of a pixel circuit in a display panel according to an embodiment of the present disclosure.
Figure 12:
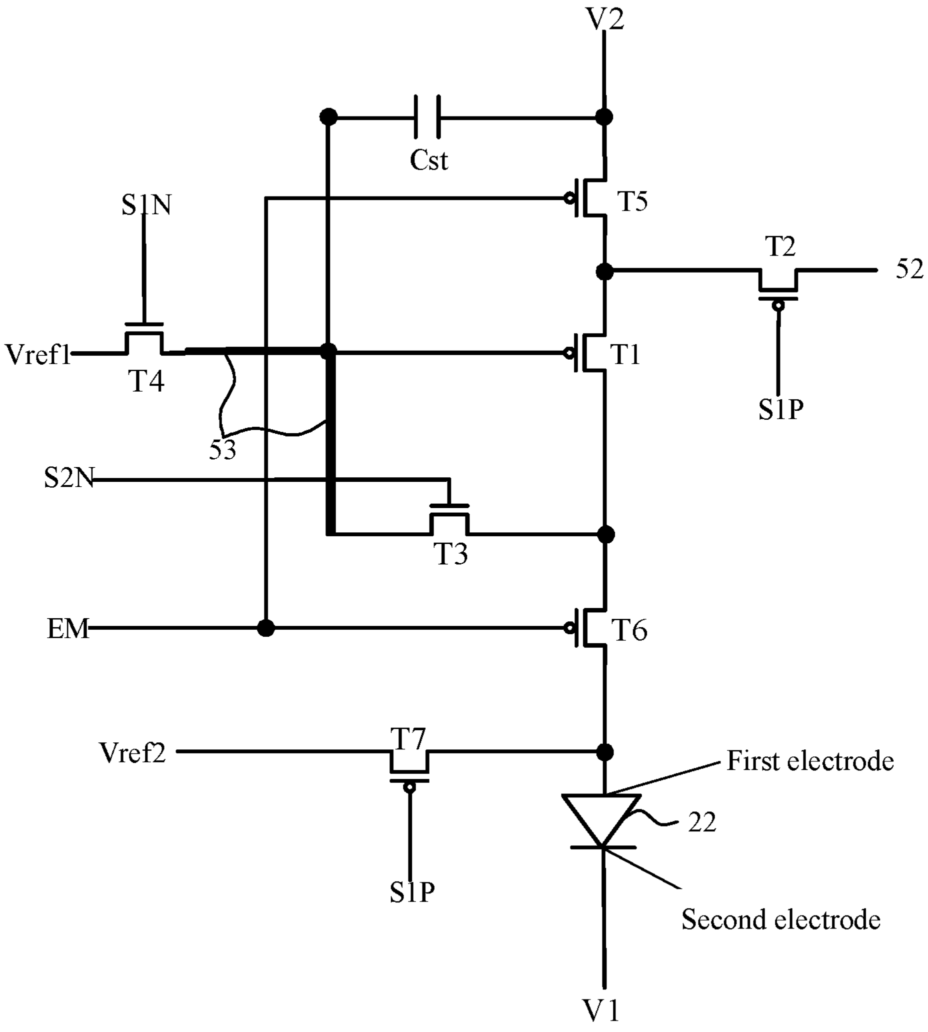
FIG. 12 shows a schematic diagram of another circuit structure of a pixel circuit in a display panel according to an embodiment of the present disclosure.

In some embodiments, as shown in FIG. 1, the display panel includes data lines 52. As shown in FIG. 11 or FIG. 12, the pixel circuit includes a driving transistor T1, and a data signal on the data line 52 may be written to a gate g1 of the driving transistor T1. The gate g1 of the driving transistor T1 is connected to the connection part 53.

In an embodiment, as shown in FIG. 11 or 12, the pixel circuit may include a third transistor T3 and a fourth transistor T4, a first electrode of the third transistor T3 is connected to a source or a drain of the driving transistor T1, and a second electrode of the third transistor T3 is connected to a gate g1 of the driving transistor T1. A first electrode of the fourth transistor T4 is connected to a first reset signal line Vref1, and a second electrode of the fourth transistor T4 is connected to a gate g1 of the driving transistor T1. A connection part 53 is connected to the second electrode of the third transistor T3 and the second electrode of the fourth transistor T4.

In the thickness direction of the display panel, the first power bus 11 may be arranged between the connection part 53 and the data line 52, the first power bus 11 and the connection part 53 may at least partially overlap, and/or the sub signal lines arranged in a same film layer as the first power bus 11 and the connection part 53 may at least partially overlap. For example, the first sub signal line 321 in the second display area AA2 is arranged in the same film layer as the first power bus 11. In the thickness direction of the display panel, the first sub signal line 321 and the connection part 53 may at least partially overlap.

In time of a frame, the signal on the data line 52 may jump frequently. The signal on the first power bus 11 and the second power supply signal line 12 are usually fixed signals. In the case that the first power bus 11 and/or the first sub signal line 321 at least partially overlap with the connection part 53, the interference of the signal on data line 52 to the signal on the connection part 53 can be reduced, to improve the stability of gate potential of the driving transistor T1.

Figure 13:
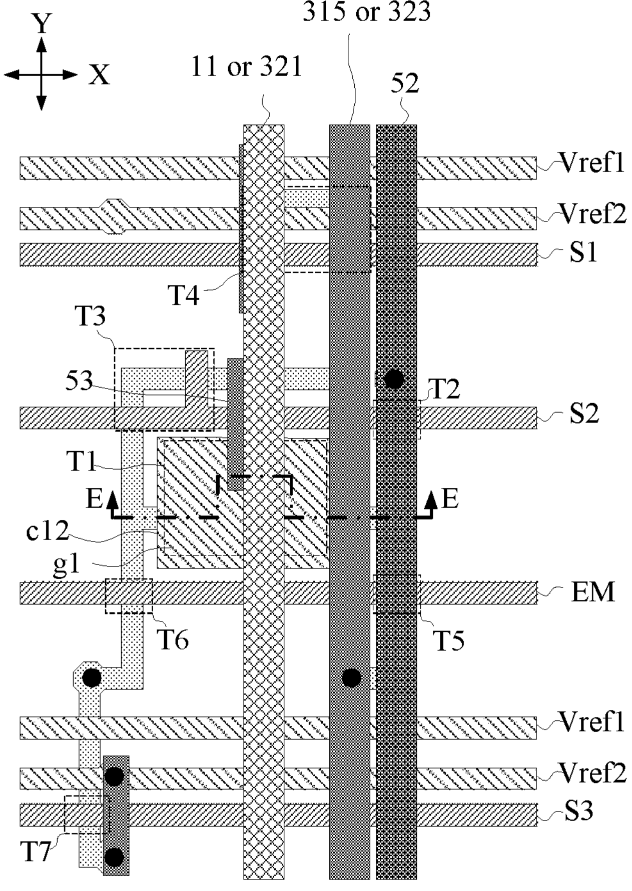
FIG. 13 shows a schematic diagram of a local layout structure of a display panel according to an the embodiment of the present disclosure.
Figure 14:
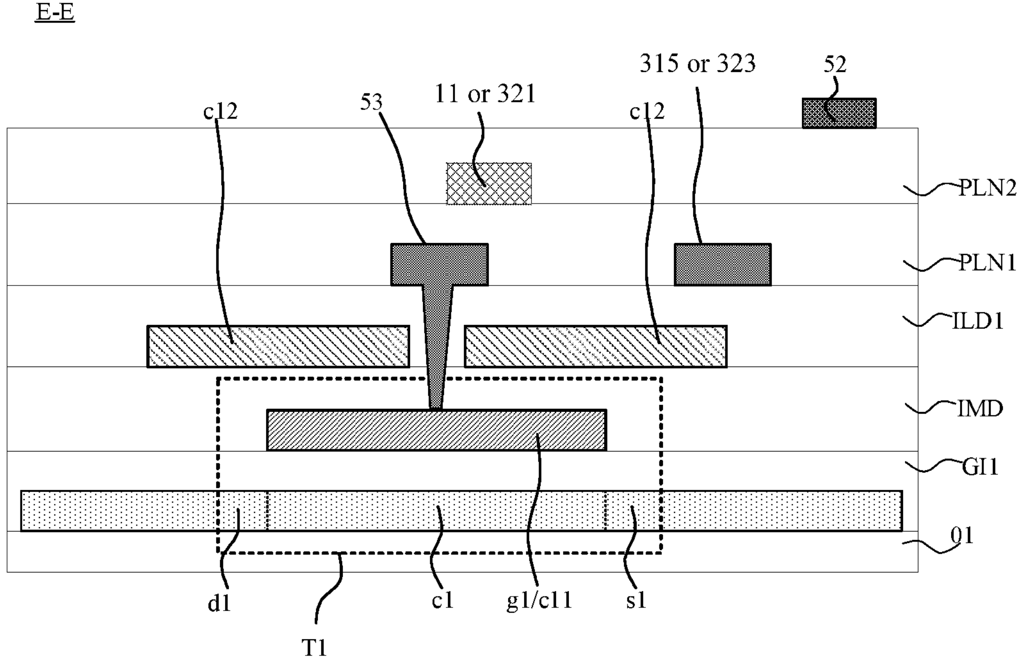
FIG. 14 shows a schematic diagram of a cross-section structure along E-E direction in FIG. 13.

The driving transistor T1 may be a P-type transistor, as shown in FIGS. 13 and 14, an active layer of the driving transistor T1 may be arranged in the first semiconductor layer, and the active layer of the driving transistor T1 may include a channel cl, as well as a source s1 and a drain d1 arranged on both sides of the channel. The gate g1 of the driving transistor T1 may be arranged in the first metal layer M1. The gate g1 of the driving transistor T1 may be reused as a first electrode plate c11 of a storage capacitor Cst. A second electrode plate c12 of the storage capacitor Cst may be arranged in the capacitor metal layer MC. The second electrode plate c12 of the storage capacitor Cst may include a hollow area. The connection part 53 may be arranged on one side of the second electrode plate c12 facing away from the substrate 01, and the connection part 53 is connected to the gate g1 via a through hole. The first power bus 11 and/or the first sub signal line 321 may be arranged on one side of the connection part 53 facing away from the substrate 01, and the data line 52 may be arranged on one side of the first power bus 11 and/or the first sub signal line 321 facing away from the substrate 01.

Understandably, in the case that the first power bus 11 is arranged in the first display area AA1, and no first power bus 11 is arranged in the second display area AA2, in the thickness direction of the display panel the first power bus 11 in the first display area AA1 may at least partially overlap with the connection part 53, and/or the first sub signal line 321 in the second display area AA2 may at least partially overlap with the connection part 53.

The fifth sub signal line 315 in the first display area AA1 may be electrically connected to a transistor T5 in the pixel circuit through a contact hole, and the third sub signal line 323 in the second display area AA2 may be electrically connected to the transistor T5 in the pixel circuit through a contact hole.

Figure 15:
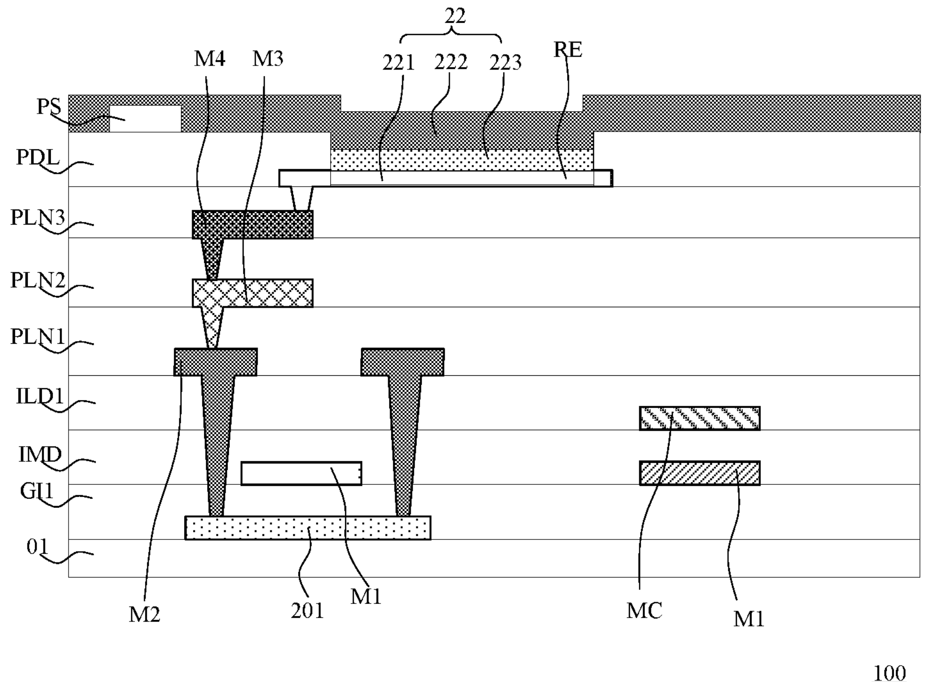
FIG. 15 shows a schematic diagram of another film layer structure of a display panel according to an embodiment of the present disclosure.

In an embodiment, as shown in FIG. 15, the display panel may further include a fourth metal layer M4, the fourth metal layer M4 is arranged between the third metal layer M3 and the anode layer RE. The connection part 53 may be arranged in the second metal layer M2, the first power bus 11 and/or the first sub signal line 321 may be arranged in the third metal layer M3, and the data line 52 may be arranged in the fourth metal layer M4.

In other embodiments, the first power bus 11 and data line 52 may be arranged in a same film layer. In this case, both the first power bus 11 and the data line 52 may extend in the second direction Y. The first power bus 11 and the data line 52 being arranged in the same layer will be beneficial to shield signal interferences between different data lines 52.

In an embodiment, at least one first power bus 11 may be provided between two adjacent data lines 52, which can improve effectiveness of signal shielding.

As shown in FIG. 11 or FIG. 12, the pixel circuit may further include a second transistor T2, a fifth transistor T5, a sixth transistor T6 and a seventh transistor T7. The connection relationships of each transistor may be referred to FIG. 11 or FIG. 12, and are not repeated here.

It should be noted that the transistor of the pixel circuit may be P-type transistor or N-type transistor. When a signal received by a gate of the P-type transistor is at a low level, the P-type transistor is turned on; when the signal received by the gate of the P-type transistor is at a high level, the P-type transistor is cut off. When a signal received by a gate of the N-type transistor is at a high level, the N-type transistor is turned on; when the signal received by the gate of the N-type transistor is at a low level, the N-type transistor is cut off.

As shown in FIG. 11, transistors T1 to T7 are all P-type transistors. Alternatively, as shown in FIG. 12, the third transistor T3 and the fourth transistor T4 are N-type transistors, while the other transistors are P-type transistors.

In addition, the first reset signal line Vref1 and the second reset signal line Vref2 are configured to transmit reset signals, the reset signals may be negative voltage signals. The voltage amplitudes on the first reset signal line Vref1 and the second reset signal line Vref2 may be different.

The first reset signal line Vref1 and the second reset signal line Vref2 may be arranged in the display area AA. For example, as shown in FIG. 2, the non-display area NA of the display panel 100 may further include a first reset bus 141 and a second reset bus 142. The first reset bus 141 is connected to the first reset signal line Vref1 and a first reset signal end V3. A first reset signal provided by the first reset signal end V3 may be transmitted to the first reset signal line Vref1 through the first reset bus 141. The second reset bus 142 is connected to the second reset signal line Vref2 and a second reset signal end V4. A second reset signal provided by the second reset signal end V4 may be transmitted to the second reset signal line Vref2 through the second reset bus 142. FIG. 2 shows an arrangement of the first reset bus 141 and the second reset bus 142 in the first direction X, which is not intended to limit the present disclosure. For example, the first reset bus 141 and the second reset bus 142 may be arranged in the non-display area on a same side of the display panel, or the first reset bus 141 and the second reset bus 142 may be arranged in the non-display area on both sides in the first direction X.

In addition, in FIGS. 11 and 12, S1, S2, S3, S1N, S2N and S1P represent scanning lines, and EM represents a light emission control signal line. The signals on scan lines S1, S2, S3, S1P and emission control signal line EM are at low level and can control the transistors connected to them to conduct. When the signals on scan lines S1, S2, S3, S1P and the light emission control signal line EM are at high levels, the transistors connected to them may be controlled to be cut off. When the signals on scan lines S1N and S2N are at high levels, the transistors connected to them may be controlled to be turned on. When the signals on scan lines S1N and S2N are at low levels, the transistors connected to them may be controlled to be cut off.

The display panel may include a substrate 01 and an organic layer arranged on one side of the substrate 01.

As mentioned above, the display panel may include metal layers and insulation layers arranged on one side of the substrate 01. Some insulation layers may be made of organic materials, and insulation layers made of organic materials may also be referred to as organic layers. For example, in FIG. 5 or FIG. 6, the first planarization layer PLN1 and/or the second planarization layer PLN2 may be made of organic materials. For example, the first planarization layer PLN1 and/or the second planarization layer PLN2 may include polyimide (PI), and the organic layers may include the first planarization layer PLN1 and/or the second planarization layer PLN2.

The inventor's found that the organic layers can release water vapor, resulting in peeling of the metal wirings.

As an example, the second power bus 12 includes sub buses arranged in different film layers and connected to each other, the sub bus arranged on the side of the organic layer away from the substrate 01 may include hollow areas. The hollow areas can help release water vapor, to avoid peeling, and can improve the reliability of display panels.

Figure 16:
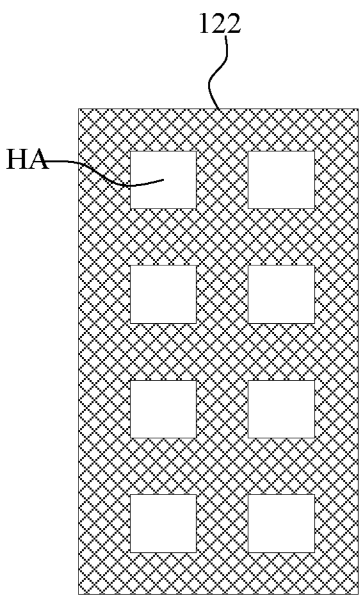
FIG. 16 shows a schematic diagram of another wiring structure in a display panel according to an embodiment of the present disclosure.

For example, as shown in FIG. 9, the second sub bus 122 of the second power bus 12 may be arranged between the first planarization layer PLN1 and the second planarization layer PLN2. As shown in FIG. 16, the second sub bus 122 may include hollow areas HA.

As mentioned above, the first power bus 11 may be connected to the second electrode 222 of the light-emitting element 22 through the second power bus 12.

In other embodiments, a contact hole may be arranged in the display area AA to directly connect the first power bus 11 and the second electrode 222.

Figure 17:
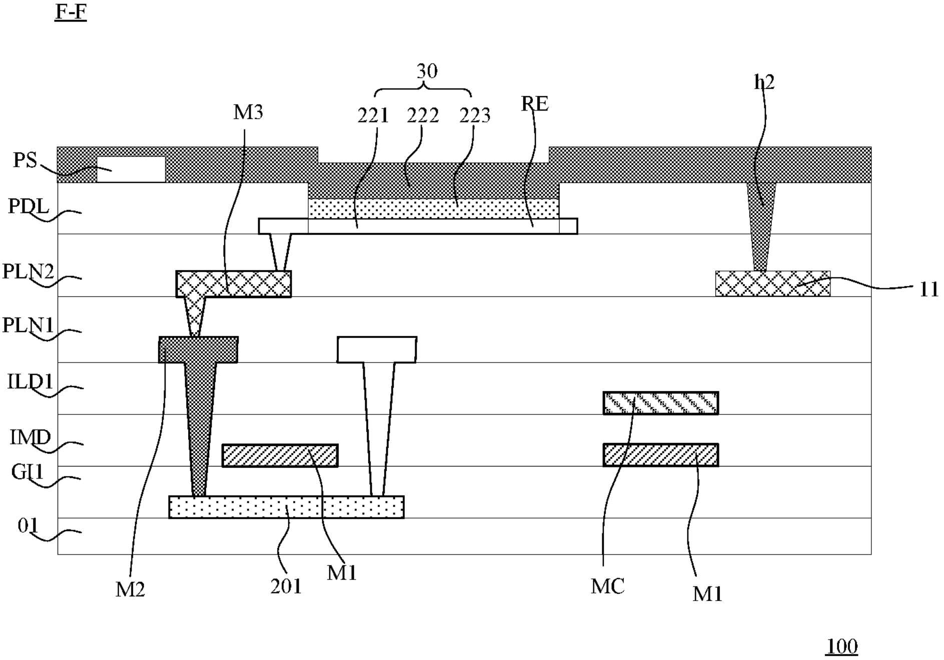
FIG. 17 shows a schematic diagram of a cross-section structure along F-F direction in FIG. 1.

In an embodiment, as shown in FIG. 17, each light-emitting element 22 includes a first electrode 221, a light-emitting layer 223, and a second electrode 222. The second electrode 222 is arranged on the side of the light-emitting layer 223 away from the first electrode 221. The first power bus 11 is connected to the second electrode 222 through a second contact hole h2, and the second contact hole h2 is arranged in the display area.

In this case, in order to avoid signal interferences, the light-emitting layers of different light-emitting elements are insulated from each other. For example, the light-emitting layer includes a hole injection layer, a hole transport layer, a light output layer, an electron transport layer and an electron injection layer in sequence in a direction away from the substrate. The hole injection layers, the hole transport layers, the light output layers, the electron transport layers and the electron injection layers of different light-emitting elements are insulated from each other.

Figure 18:
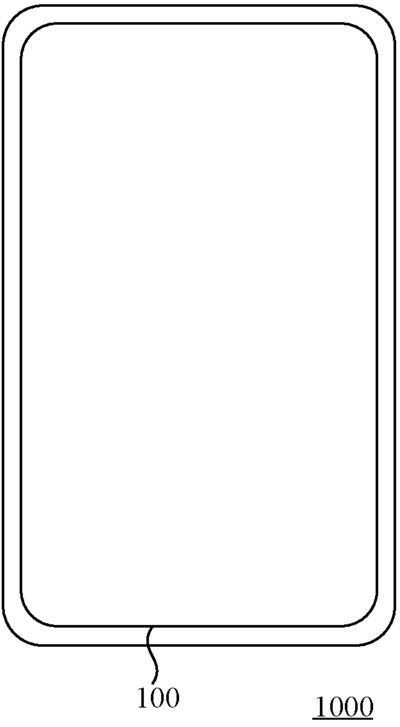
FIG. 18 shows a structural schematic diagram of a display device according to an embodiment of the present disclosure.

Embodiments of the present disclosure provide a display device. The display device includes the display panel described in the present disclosure. FIG. 18 is a structural schematic diagram of a display device according to the embodiments of the present disclosure. The display device 1000 provided in FIG. 18 includes the display panel 100 according to the above embodiments of the present disclosure. An embodiment in FIG. 18 only takes a mobile phone as an example to illustrate the display device 1000. Understandably, the display device according to the embodiments of the present disclosure may be a wearable product, a computer, a television, a vehicle-mounted display device, and other display devices with display functions, which is not limited in the present disclosure. The display device according to the embodiments of the present disclosure has the beneficial effects of the display panel according to the embodiments of the present disclosure. For details, reference may be made to the specific description of the display panel in the above embodiments, which is not repeated in the embodiment.

According to the embodiments described in the present disclosure, not all details are fully described in the embodiments do not, and the present disclosure is not only limited to the embodiments. Based on the above description, many modifications and changes can be made. This description selects and specifically describes the embodiments in order to better explain the principles and practical applications of the present disclosure, the embodiments of the present disclosure and modifications based on the present disclosure. The present disclosure is only limited by the claims and the full scopes and equivalents.

What is claimed is:

1. A display panel, comprising a display area and a non-display area at least partially surrounding the display area, the display panel further comprising:

a first power bus, arranged in the display area;

a second power bus, arranged in the non-display area, and electrically connected to the first power bus;

a third power bus, arranged in the non-display area;

wherein the display area comprises: a plurality of pixel circuits and light-emitting elements electrically connected to the pixel circuits;

wherein the first power bus is connected to the light-emitting elements;

wherein the third power bus is connected to the pixel circuits;

wherein the display area further comprises a first display area and a second display area that are adjacent to each other, and in a first direction, the first display area is arranged between the non-display area and the second display area, the first power bus is arranged in the first display area; and wherein the display panel further comprises: a first power supply signal line, arranged in the first display area and the second display area, and electrically connected to the third power bus, wherein the first power supply signal line in the second display area comprises a plurality of first sub signal lines and a plurality of second sub signal lines that are arranged in different film layers and electrically connected to each other, the first power bus and at least one of the plurality of first sub signal lines are arranged in a same film layer, and at least one of the plurality of second sub signal lines is arranged in a different film layer from the first power bus.

2. The display panel according to claim 1, further comprising a substrate, and the plurality of first sub signal lines are arranged on a side of the plurality of second sub signal lines away from the substrate.

3. The display panel according to claim 2, wherein the first power supply signal line in the second display area further comprises a third sub signal line, and the third sub signal line is arranged between the plurality of first sub signal lines and the plurality of second sub signal lines.

4. The display panel according to claim 1, further comprising a data line, wherein a pixel circuit comprises a driving transistor, and a gate of the driving transistor is connected to a connection part;

in a thickness direction of the display panel, the first power bus is arranged between the connection part and the data line, the first power bus at least partially overlaps with the connection part, and/or, the at least one the plurality of first sub signal lines arranged in the same film layer as the first power bus at least partially overlap with the connection part.

5. The display panel according to claim 1, wherein the at least one of the plurality of second sub signal lines arranged in the different film layer from the first power bus and the first power supply signal line in the first display area are arranged in a same film layer.

6. The display panel according to claim 1, wherein in a thickness direction of the display panel, the first power bus at least partially overlapped with the first power supply signal line in the first display area.

7. The display panel according to claim 1, further comprising a data line, wherein the first power bus and the data line are arranged in a same film layer.

8. The display panel according to claim 7, wherein at least one first power bus is arranged between two adjacent data lines.

9. The display panel according to claim 1, wherein the first power bus is in a grid structure;

and/or, the first power supply signal line in the first display area is in a grid structure;

and/or, the plurality of first and second sub signal lines in the same film layer as the first power bus are in a grid structure.

10. The display panel according to claim 1, wherein a width of the first display area in the first direction is smaller than a width of the second display area in the first direction.

11. The display panel according to claim 1, wherein the first display area comprises an arc edge, and the non-display area comprises a corner area adjacent to the arc edge, and the corner area comprises a connection line connecting the first power bus and the second power bus, and the second power bus is connected to a first power supply end of the display panel.

12. The display panel according to claim 11, wherein the second power bus comprises a plurality of sub buses arranged in different film layers and connected to each other, the connection line, the first power bus and at least one layer of the sub buses are arranged in a same film layer.

13. The display panel according to claim 11, further comprising a substrate, wherein the second power bus comprises a plurality of sub buses that are sequentially stacked in a direction away from the substrate and connected to each other, and the first power bus is connected to a first sub bus that is the sub bus in a layer farthest from the substrate via a first contact hole.

14. The display panel according to claim 13, wherein at least one of the light-emitting elements comprises a first electrode, a light-emitting layer and a second electrode, and the second electrode is arranged on a side of the light-emitting layer away from the first electrode;

the first sub bus and the first electrode are arranged in a same film layer, and the first sub bus is connected to the second electrode.

15. The display panel according to claim 14, wherein the non-display area comprises a shift register, and orthographic projections of the sub buses other than the first sub bus on the substrate are at a side of an orthographic projection of the shift register on the substrate away from the display area.

16. The display panel according to claim 11, wherein intersection of the connection line and the arc edge is a tangent point, and the connection line is perpendicular to a tangent line passing through the tangent point.

17. The display panel according to claim 11, wherein the second power bus comprises a first segment, an arc segment and a second segment, the arc segment is connected between the first segment and the second segment, the second segment is connected to the first power supply end, and the arc segment is parallel to the arc edge, the third power bus comprises a third segment and a fourth segment, the third segment is connected between the fourth segment and the first power supply signal line in the display area, and the fourth segment is connected to a second power supply end of the display panel;

the second segment comprises a first sub segment and a second sub segment, the first sub segment is connected between the arc segment and the second sub segment, the first sub segment and the third sub segment extend in the first direction, the second sub segment and the fourth segment extend in a second direction, and the first direction intersects with the second direction.

18. A display device, comprising a display panel, the display panel comprising a display area and a non-display area at least partially surrounding the display area, the display panel further comprising:

a first power bus, arranged in the display area;

a second power bus, arranged in the non-display area, and electrically connected to the first power bus;

a third power bus, arranged in the non-display area;

wherein the display area comprises: a plurality of pixel circuits and light-emitting elements electrically connected to the pixel circuits;

wherein the first power bus is connected to the light-emitting elements;

wherein the third power bus is connected to the pixel circuits;

wherein the display area further comprises a first display area and a second display area that are adjacent to each other, and in a first direction, the first display area is arranged between the non-display area and the second display area, the first power bus is arranged in the first display area; and wherein the display panel further comprises: a first power supply signal line, arranged in the first display area and the second display area, and electrically connected to the third power bus, wherein the first power supply signal line in the second display area comprises a plurality of first sub signal lines and a plurality of second sub signal lines that are arranged in different film layers and electrically connected to each other, the first power bus and at least one of the plurality of first sub signal lines are arranged in a same film layer, and at least one of the plurality of second sub signal lines is arranged in a different film layer from the first power bus.

* * * * *